United States Patent
Harrington, III

(10) Patent No.: US 9,117,709 B2
(45) Date of Patent: Aug. 25, 2015

(54) DEVICE ARCHITECTURE AND METHOD FOR PRECISION ENHANCEMENT OF VERTICAL SEMICONDUCTOR DEVICES

(71) Applicant: D3 Semiconductor LLC, Addison, TX (US)

(72) Inventor: Thomas E. Harrington, III, Carrollton, TX (US)

(73) Assignee: D3 Semiconductor LLC, Addison, TX (US)

( * ) Notice: Subject to any disclaimer, the term of this patent is extended or adjusted under 35 U.S.C. 154(b) by 0 days.

(21) Appl. No.: 14/091,315

(22) Filed: Nov. 26, 2013

(65) Prior Publication Data

US 2014/0145240 A1    May 29, 2014

Related U.S. Application Data

(60) Provisional application No. 61/729,720, filed on Nov. 26, 2012.

(51) Int. Cl.
  *H01L 21/66*   (2006.01)
  *H01L 27/06*   (2006.01)

(52) U.S. Cl.
  CPC .............. *H01L 22/14* (2013.01); *H01L 22/20* (2013.01)

(58) Field of Classification Search
  CPC ............................... H01L 22/14; H01L 22/20
  USPC .............................................. 438/10; 257/139
  See application file for complete search history.

(56) References Cited

U.S. PATENT DOCUMENTS

| | | |
|---|---|---|
| 5,446,310 A | 8/1995 | Baliga et al. |
| 5,563,447 A | 10/1996 | Lake et al. |
| 5,831,291 A | 11/1998 | Evans et al. |
| 7,782,083 B2 | 8/2010 | Lalithambika et al. |
| 7,960,997 B2 | 6/2011 | Williams |
| 2009/0200578 A1 | 8/2009 | Xu |
| 2012/0194260 A1* | 8/2012 | Nakazawa ................... 327/525 |

* cited by examiner

*Primary Examiner* — Walter H Swanson
(74) *Attorney, Agent, or Firm* — Schultz & Associates, P.C.

(57) ABSTRACT

Improvement of key electrical specifications of vertical semiconductor devices, usually found in the class of devices known as discrete semiconductors, has a direct impact on the performance achievement and power efficiency of the systems in which these devices are used. Imprecise vertical device specifications cause system builders to either screen incoming devices for their required specification targets or to design their system with lower performance or lower efficiency than desired. Disclosed is an architecture and method for achieving a desired target specification for a vertical semiconductor device. Precise trimming of threshold voltage improves targeting of both on-resistance and switching time. Precise trimming of gate resistance also improves targeting of switching time. Precise trimming of a device's effective width improves targeting of both on-resistance and current-carrying capability. Device parametrics are trimmed to improve a single device, or a parametric specification is targeted to match specifications on two or more devices.

7 Claims, 14 Drawing Sheets

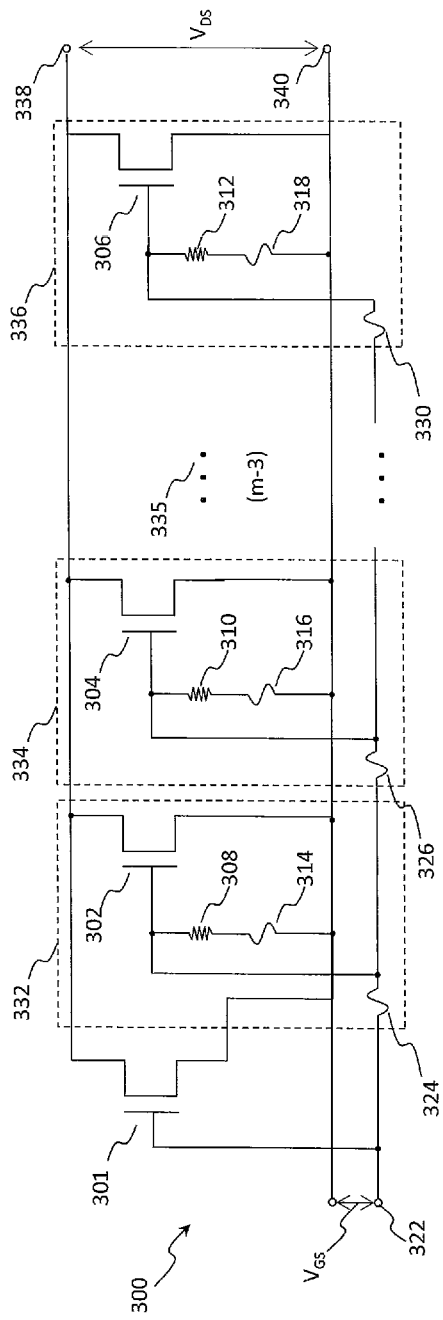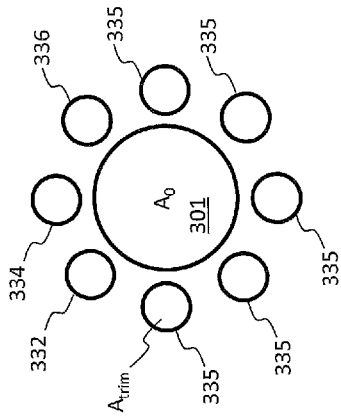
Figure 3A
Figure 3B

DEVICE ARCHITECTURE AND METHOD FOR PRECISION ENHANCEMENT OF VERTICAL SEMICONDUCTOR DEVICES

CROSS-REFERENCE TO RELATED APPLICATIONS

This application claims priority benefit from U.S. Provisional Application No. 61/729,720 filed Nov. 26, 2012. The patent application identified above is incorporated here by reference in its entirety to provide continuity of disclosure.

TECHNICAL FIELD OF THE INVENTION

This invention relates generally to the methods and techniques for improving the specifications of vertical semiconductor devices. In particular, this invention details novel methods for improving various parametric specifications of vertical semiconductor devices utilizing device trimming.

BACKGROUND OF THE INVENTION

Semiconductor manufacturing processes must balance competing goals of cost, yield, and performance. While market demands drive manufacturers to reduce costs, improved system performance drives ever-tighter component tolerances. In many applications, the system performance requirements exceed what can be attained in a cost effective manufacturing process.

Similar issues exist in the manufacture of power supply components, for example, the variations in parametric distributions of discrete devices such as VDMOS, IGBTs, and vertical power diodes limit efficiency and switching speed in system designs.

Two primary design parameters of interest to power supply designers are the threshold voltage ($V_t$) and gate resistance of the switching VDMOS device. Variations in $V_t$ and gate resistance determine system timing constraints that propagate into overall power supply efficiency ratings for the circuit utilizing the device. Tighter and more accurate control of $V_t$ and gate resistance distributions provides many advantages. For example, some of these advantages include closer system timing, reduction in guard bands, lower switching losses, and increased efficiency. There are several device parameters of this nature where the absolute value of the parameter is not as important as the width of the variation observed for the parameter. Tighter controls of these distributions would allow the designer the flexibility to make tradeoffs in the system design, improving a particular performance characteristic as needed for a particular application.

Various techniques have been employed over the years to tighten parametric distributions from a cost effective manufacturing process, but none have been completely satisfactory.

One solution of the prior art has been to concentrate on low cost processing, test the resulting components, and sort the manufactured devices into various parametric distribution categories and to choose only those which are in an acceptable range. However, this approach raises cost because large numbers of parts from the overall population outside the distribution range must be discarded.

Another approach of the prior art has been to modify the design of the components slightly to allow trimming with a laser or other post-fabrication techniques to shift large numbers of the parts into a desired parametric range. However, this method has not been successfully applied to vertical semiconductor devices. The reason that trimming techniques are difficult to apply to vertical semiconductor devices is because the internal units making up the vertical device all have a common connection on the bottom side of the wafer. For example, the bottom side of the wafer for a VDMOS is the common drain terminal for all internal units making up the device. The bottom side of the wafer for an IGBT is the common collector terminal for all internal units making up the device. In order to implement trimming on devices like these with common terminals, novel techniques such as those described in the present invention can be utilized.

SUMMARY OF THE DISCLOSURE

"Vertical" semiconductor devices are semiconductor devices where the primary direction of current flow is vertical. Power discrete semiconductor devices are often built as vertical semiconductor devices.

According to a preferred embodiment, a method is provided for targeting via laser trimming a specific threshold voltage of a VDMOS, IGBT, or vertical gated-diode using at least two parallel device groups, with each group having a different threshold voltage, with these different threshold voltages bracketing the target threshold voltage. The same method may be used to match the threshold voltage of two or more VDMOSs, IGBTs, or vertical gated-diodes on the same or on separate die.

According to another preferred embodiment, a method is provided for targeting via laser trimming a specific on-resistance or current-carrying capability of a VDMOS, IGBT, or vertical diode using multiple parallel device segments. The same method may be used to match the on-resistance or current-carrying capability of two or more VDMOSs, IGBTs, or vertical diodes on the same or on separate die.

According to another preferred embodiment, a method is provided for targeting via laser trimming a specific switching time of a VDMOS or IGBT using multiple parallel gate resistors. The same method may be used to match the switching time of two or more VDMOSs or IGBTs on the same or on separate die.

According to another preferred embodiment, a method is provided for targeting via laser trimming a specific switching time of a VDMOS or IGBT using both multiple parallel device segments with at least two different threshold voltages and multiple parallel gate resistors. The same method may be used to match the switching time of two or more VDMOSs or IGBTs on the same or on separate die.

According to another preferred embodiment, a method is provided for targeting via laser trimming a specific gate resistance of a VDMOS or IGBT using multiple parallel gate resistors. The same method may be used to match the gate resistance of two or more VDMOSs or IGBTs on the same or on separate die.

According to another preferred embodiment, a method is provided for targeting via laser trimming a specific breakdown voltage of a vertical diode using multiple parallel device elements with at least two different breakdown voltages which bracket the target breakdown voltage. The same method may be used to match the breakdown voltage of two or more vertical diodes on the same or on separate die.

BRIEF DESCRIPTION OF THE DRAWINGS

FIG. 3A illustrates a trimmable composite VDMOS device having a primary device interconnected with an element group of multiple trim sections.

FIG. 3B illustrates a device layout for a trimmable composite VDMOS device.

DETAILED DESCRIPTION

Figure 1A:
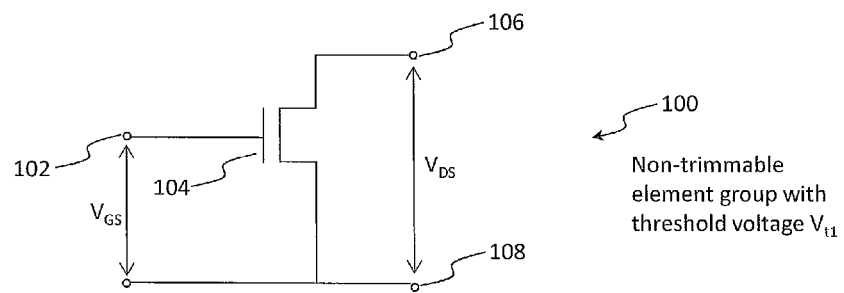
FIG. 1A illustrates a primary element group having a non-trimmable section with a first threshold voltage, for use in a composite VDMOS device.

While the making and using of various embodiments of the present disclosure are discussed in detail below, it should be appreciated that the present disclosure provides many applicable inventive concepts that can be embodied in a wide variety of specific contexts. The specific embodiments discussed herein are merely illustrative of specific ways to make and use what is disclosed and do not limit its scope.

"Threshold voltage," in a MOSFET transistor device having a gate terminal, source terminal and a drain terminal, is understood to mean the value of the gate-source voltage $V_{GS}$ when the conducting channel of the device just begins to connect the source terminal and the drain terminal of the device, allowing significant current to flow between the source and drain terminals.

"On-resistance" is commonly understood to be the resistance of a semiconductor device when it is biased in the on-state by applying certain voltages and/or currents to its terminals. For a VDMOS device, for example, on-resistance is often defined as drain current $(I_d)$ divided by drain-source voltage $(V_{ds})$ when $V_{ds}$ is set to 0.1V and the gate-source voltage $(V_{gs})$ is set to 10V.

"Switching time" refers to the time that it takes for a device to switch from its "off" state to its "on" state or from its "on" state to its "off" state. Switching time is measured by computing the time required for the off state to rise from 10% to 90% of its average on state value of either voltage or current, thus turning the device on, or the time required for the on state to fall from 90% to 10% of its average on state value of either voltage or current, thus turning the device off. "Effective width" of a semiconductor device is the width of conducting region of the device. Larger effective width allows the device to carry a larger amount of current, and smaller effective width restricts the device to carry a smaller amount of current. A device having a larger effective width will also have a smaller on-resistance than a device having a smaller effective width.

The Vertical-Diffused MOSFET or Vertical-Drift MOSFET (VDMOS) is a MOSFET transistor in which the flow of current is vertical, usually from top to bottom. In older generations of processing, the channel region of this device type, of opposite doping polarity to the source and drain of the device, was created by a high temperature diffusion step, hence the "Diffused" in the name. The "Diffused" name is sometimes replaced by the term "Drift" today, as most modern devices employ some type of Drift region to support high voltages.

A vertical diode is a diode in which the anode is located on one surface of the device and the cathode is located on the opposite surface of the device, so that the primary direction of current flow is perpendicular to these surfaces.

The breakdown voltage of a vertical diode is commonly defined as the voltage at which the off state device begins to electrically break down and pass a specified level of current.

The Insulated-Gate Bipolar Transistor (or IGBT) is a vertical current flow Bipolar transistor which employs an insulated gate terminal (very similar to the gate terminal of a MOSFET) to turn the device on and initiate current flow, and for turning the device off and stopping current.

Referring to FIG. 1A, a device element 100 includes a VDMOS device 104 having a gate electrode 102, a source electrode 108 and a drain electrode 106. VDMOS device 104 has a threshold voltage $V_{t1}$. In use, a voltage $V_{DS}$ is applied between the drain electrode and the source electrode and a voltage $V_{GS}$ is applied between the gate electrode and the source electrode. Device element 100 forms a basic device used in a trim section of a device element group with multiple trim sections.

Figure 1B:
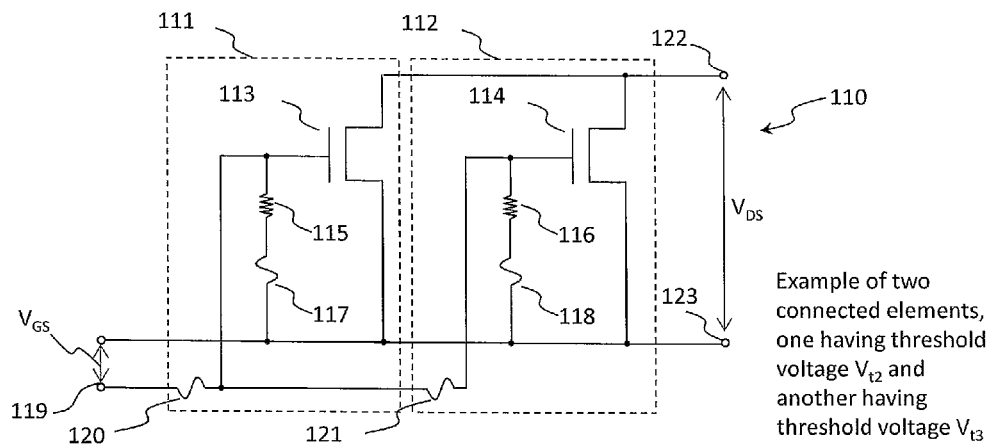
FIG. 1B illustrates a combination of two element groups, having trim sections with two different threshold voltages.

Referring to FIG. 1B, an element group 110 includes two interconnected VDMOS device trim sections, trim section 111 and trim section 112. Element group 110 has a gate terminal 119, a drain terminal 122 and a source terminal 123. In use, a voltage $V_{DS}$ is applied between the drain terminal and the source terminal and a voltage $V_{GS}$ is applied between the gate terminal and the source terminal.

Trim section 111 includes device 113, with its drain electrode connected to drain terminal 122 and its source electrode connected to source terminal 123. The gate electrode of device 113 is connected to gate terminal 119 through isolation fuse 120. The gate electrode of device 113 is further connected to source terminal 123 through pull-down resistor 115 in series with activation fuse 117. Device 113 exhibits a threshold voltage $V_{t2}$.

Trim section 112 includes device 114, with its drain electrode connected to drain terminal 122 and its source electrode connected to source terminal 123. The gate electrode of device 114 is connected to gate terminal 119 through isolation fuse 121 and isolation fuse 120 which are connected in series. The gate electrode of device 114 is further connected to source terminal 123 through pull-down resistor 116 in series with activation fuse 118. Device 114 exhibits a threshold voltage $V_{t3}$. Element group 110 has a selectable threshold voltage of $V_{t2}$ or $V_{t3}$.

Figure 1C:
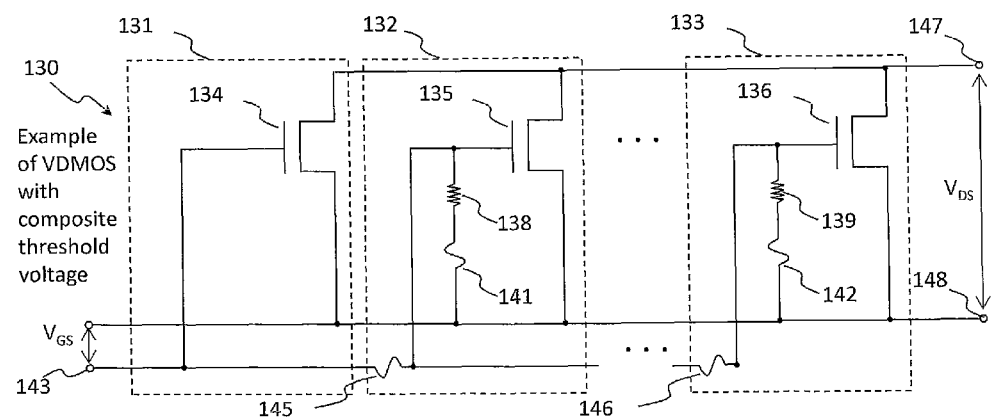
FIG. 1C illustrates the nth element group having multiple trim sections and an nth threshold voltage, for use in a trimmable composite VDMOS device.

Referring to FIG. 1C, an example composite VDMOS device 130 consists of n interconnected VDMOS device sections including non-trimmable section 131 and trim sections 132 and 133. There are (n–3) trim sections interconnected between trim section 132 and trim section 133. Composite device 130 has a gate terminal 143, a drain terminal 147 and a source terminal 148. A set of n isolation fuses including isolation fuses 145 and 146 are connected in series to gate terminal 143. In use, a voltage $V_{DS}$ is applied between the drain terminal and the source terminal and a voltage $V_{GS}$ is applied between the gate terminal and the source terminal.

Non-Trimmable section 131 includes device 134, with its drain electrode connected to drain terminal 147 and its source electrode connected to source terminal 148. The gate electrode of device 134 is connected to gate terminal 143. Device 134 exhibits threshold voltage $V_{t1}$.

Trim section 132 includes device 135, with its drain electrode connected to drain terminal 147 and its source electrode connected to source terminal 148. The gate electrode of device 135 is connected to gate terminal 143 through isolation fuse 145. The gate electrode of device 135 is further connected to source terminal 148 through pull-down resistor 138 in series with activation fuse 141. Alternatively, the activation fuse 141 can be placed between the pull-down resistor 138 and the gate of device 135 in order to reduce any parasitic resistance associated with the pull-down resistor. Device 135 exhibits threshold voltage $V_{t2}$.

Trim section 133 includes device 136, with its drain electrode connected to drain terminal 147 and its source electrode connected to source terminal 148. The gate electrode of device 136 is connected to gate terminal 143 through isolation fuse 145, isolation fuse 146 and all intermediate isolation fuses connected in series between isolation fuse 146 and isolation fuse 145. The gate electrode of device 136 is further connected to source terminal 148 through pull-down resistor 139 in series with activation fuse 142. Device 136 exhibits threshold voltage $V_{tn}$.

There are (n–3) intermediate trim sections between trim section 132 and 133 in composite device 130 interconnected similarly as trim section 132 and 133 to gate terminal 143, drain terminal 147 and source terminal 148. One or more trim sections may have the same threshold voltage value for trimming purposes. Example composite device 130 has selectable threshold voltage in range of threshold voltages between $V_{tn}$ and $V_{t1}$, where, $V_{tn} < V_{t2} < V_{t1}$.

When an activation fuse is connected, for example as in activation fuse 142, a shunt is formed through pull-down resistor 139 and activation fuse 142 where current flows from the gate terminal to the source terminal. Because of the shunt, insufficient current flows from the gate terminal to the source terminal through device 136 in order to allow device 136 to conduct.

A trim section is "activated" when its corresponding activation fuse is "blown". A trim section is electrically "isolated" from the element group when at least one isolation fuse between the trim section and the gate terminal 143 is "blown." In the embodiment of FIG. 1C, no trim sections are "isolated" and no trim sections are "activated." In a number of additional embodiments, there are a number of different configurations of composite device 130 which are selectable by blowing isolation and activation fuses.

Figure 1D:
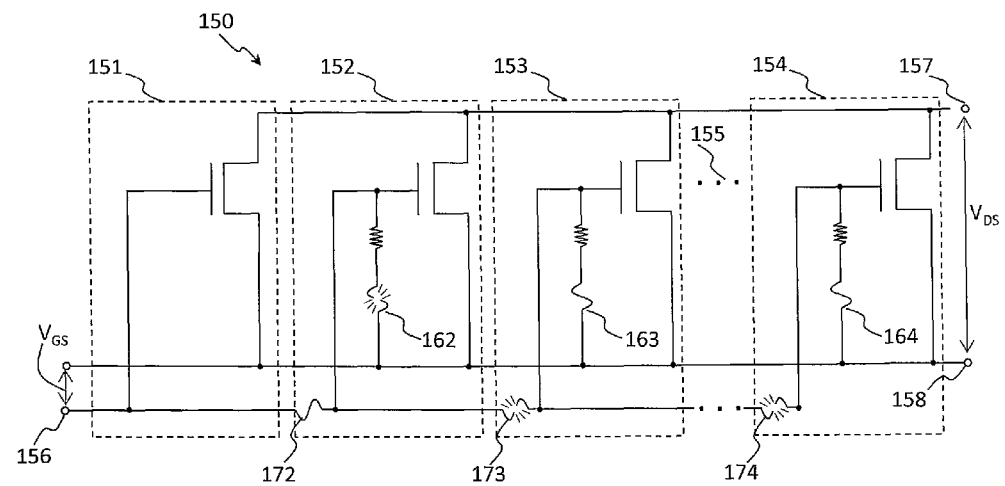
FIG. 1D illustrates an example configuration of an element group for use within a trimmable composite VDMOS device having multiple trim sections.

Referring to FIG. 1D, a further example of isolation and activation of trim sections is provided. In FIG. 1D, element group 150 consists of n interconnected VDMOS device sections including non-trimmable section 151 and trim sections 152, 153 and 154. Each trim section includes a VDMOS device with a gate electrode, a source electrode and a drain electrode. There are (n–4) trim sections 155 between trim section 153 and 154. Element group 150 has a gate terminal 156, a drain terminal 157 and a source terminal 158. In use, a voltage $V_{DS}$ is applied between the drain terminal and the source terminal and a voltage $V_{GS}$ is applied between the gate terminal and the source terminal.

A set of n isolation fuses including isolation fuses 172, 173 and 174 are connected in series to gate terminal 156. Isolation fuses 173 and 174 are blown, thereby disconnecting gate terminal 156 from trim section 153 and from trim section 154. Blowing isolation fuse 173 also results in a cascading isolation of trim sections 155 which are also disconnected from the gate terminal. Trim sections 153, 154 and 155 are therefore electrically isolated from the gate terminal and do not draw any current as a result of $V_{GS}$ or $V_{DS}$ and do not contribute to the operation of element group 150.

A set of n activation fuses include activation fuses 162, 163 and 164 connecting the gate electrodes in each trim section through a pull-down resistor to the source terminal. Activation fuse 162 is blown. Activation fuses 163 and 164 are connected. Since activation fuse 162 is blown, the device of trim section 152 can conduct current from the drain terminal to the source terminal. Therefore trim sections 151 and 152 actively conduct current according to the drain source voltage $V_{DS}$ and as controlled by the gate source voltage $V_{GS}$. The threshold voltage of element group 150 is the smallest threshold voltage of sections 151 and 152.

Figure 2:
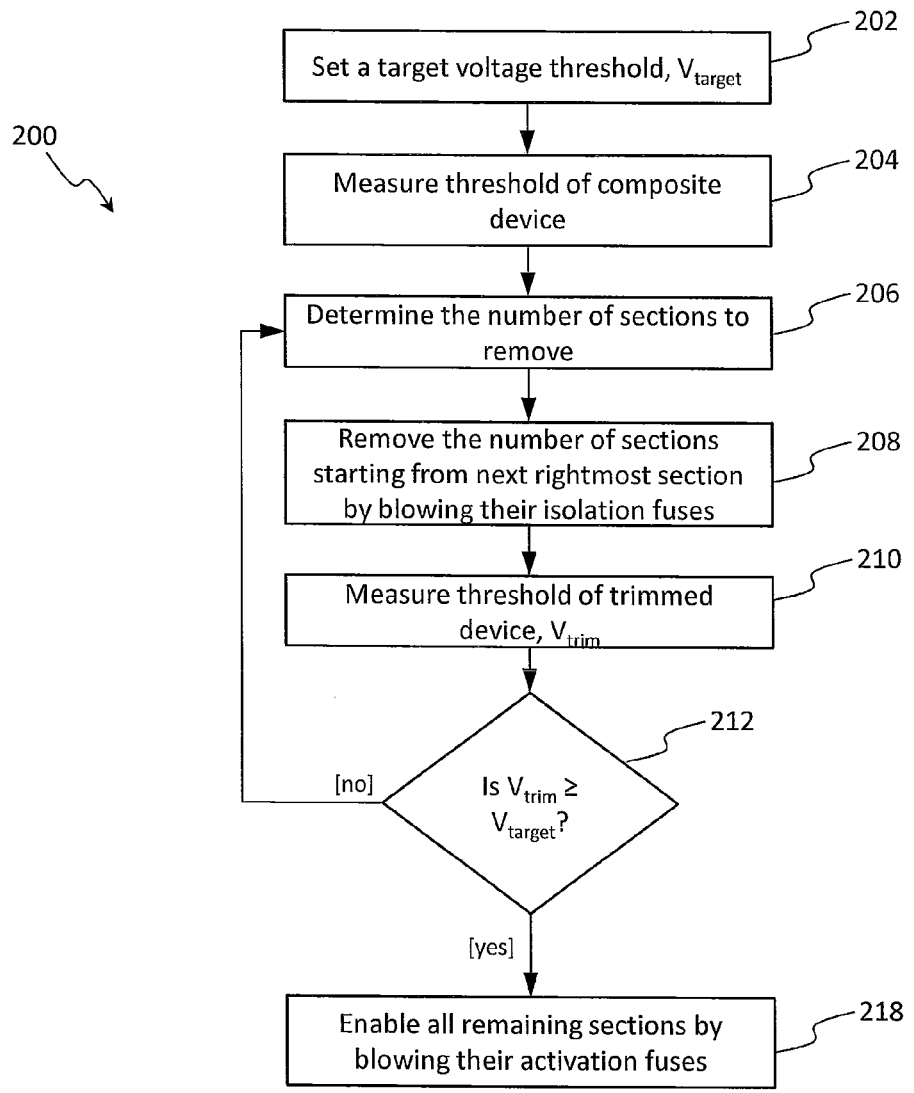
FIG. 2 illustrates a procedure for trimming an element group with multiple trim sections from an untrimmed composite threshold voltage to achieve a target threshold voltage.

Referring to FIG. 2, an example procedure 200 for trimming an element group to a specific threshold voltage is as follows. At step 202, a target threshold voltage is selected. At step 204, the threshold voltage of the composite device is measured using a standard linear Vt measurement, or a saturated Vt measurement, or a Vt measurement based on an area-weighted drain current specification, depending upon a specific application. The threshold voltage of each element group having different threshold voltages can be determined using a measurement of the threshold voltage of the composite device or using measurements of individual test devices typically found in semiconductor manufacturing processes. At step 206, based on the measured threshold voltage from step 204, a calculation is made of a number of trim sections to remove to achieve the target threshold voltage. At step 208, starting with the right-most isolation fuse in the element group that is still active, isolation fuses for trim sections are blown from right to left until the calculated number of trim sections are removed. For example, in FIG. 1D, isolation fuses are blown starting with isolation fuse 174 and ending with isolation fuse 173. Blowing the isolation fuses from right to left increases the overall composite threshold voltage of the device to a threshold voltage approaching the target threshold voltage.

At step 210, the trimmed threshold voltage of the composite device is measured. At step 212, if the trimmed threshold voltage is still lower than the target threshold voltage, then the procedure is repeated, beginning with step 206, until the target threshold voltage is attained.

At step 212, if the trimmed threshold voltage is greater than the target threshold voltage or equal to the target threshold within a predefined tolerance range, the procedure moves to step 218 where each remaining trim section (each trim section to the left of the last blown isolation fuse) in the element group is permanently enabled by blowing its corresponding activation fuse. For example, in FIG. 1D, activation fuse 162 is blown since isolation fuse 173 is the last blown isolation fuse.

Referring to FIG. 3A, a composite VDMOS device 300 consists of a set of m device trim sections including device trim sections 332, 334 and 336 connected in parallel to each other and to a primary device 301. The gate electrode of primary device 301 is connected to gate terminal 322, the drain electrode of primary device 301 is connected to drain terminal 338 and the source electrode of primary device 301 is connected to source terminal 340.

Device trim section 332 is connected in parallel to primary device 301 through isolation fuse 324. An additional set of (m−3) device trims sections 335 are connected between device trim section 334 and device trim section 336. A set of m isolation fuses including isolation fuses 324, 326 and 330 are connected in series to gate terminal 322. A voltage $V_{DS}$ is applied between the drain terminal and the source terminal and a voltage $V_{GS}$ is applied between the gate terminal and the source terminal.

Trim section 332 includes device 302, with its drain electrode connected to drain terminal 338 and its source electrode connected to source terminal 340. The gate electrode of device 302 is connected to gate terminal 322 through isolation fuse 324. The gate electrode of device 302 is further connected to source terminal 340 through pull-down resistor 308 in series with activation fuse 314.

Trim section 334 includes device 304, with its drain electrode connected to drain terminal 338 and its source electrode connected to source terminal 340. The gate electrode of device 304 is connected to gate terminal 322 through isolation fuse 326 and isolation fuse 324. The gate electrode of device 304 is further connected to source terminal 340 through pull-down resistor 310 in series with activation fuse 316.

Trim section 336 includes device 306, with its drain electrode connected to drain terminal 338 and its source electrode connected to source terminal 340. The gate electrode of device 306 is connected to gate terminal 322 through isolation fuse 330, isolation fuse 326, isolation fuse 324 and all intermediate isolation fuses connected in series between isolation fuse 330 and isolation fuse 326. The gate electrode of device 306 is further connected to source terminal 340 through pull-down resistor 312 in series with activation fuse 318.

There are (m−3) intermediate trim sections between trim section 334 and 336 in element group 300 interconnected similarly as trim sections 332, 334 and 336 to gate terminal 322, drain terminal 338 and source terminal 340.

Referring to FIG. 3B an exemplary device layout for composite device 300 has a conducting area $A_{total}$ which is divided between the conducting area $A_0$ of primary device 301 and the sum of the conducting areas $A_{trim}$ of the set of device trim sections 332, 334, 335 and 336. The primary device, having a conducting area $A_0$, contributes an area fraction $F_0 = A_0/A_{total}$ to the conductance of the composite device. A single device trim section, having a conducting area $A_{trim}$, contributes an area fraction $F_{trim} = A_{trim}/A_{total}$ to the conductance of the composite device and to the corresponding on-resistance of the composite device.

In an embodiment of composite device 300, with no electrically isolated trim sections, composite device 300 has an on-resistance that is less than a desired on-resistance. In another embodiment of composite device 300 with no electrically isolated trim sections, composite device 300 has a current-carrying capability that is greater than a desired current-carrying capability. In an additional embodiment, the on-resistance of composite device 300 is selectable to within a desired tolerance range by electrically isolating a subset of trim sections. In another embodiment, the current-carrying capability of composite device 300 is selectable to within a desired tolerance range by electrically isolating a subset of trim sections.

Figure 4:
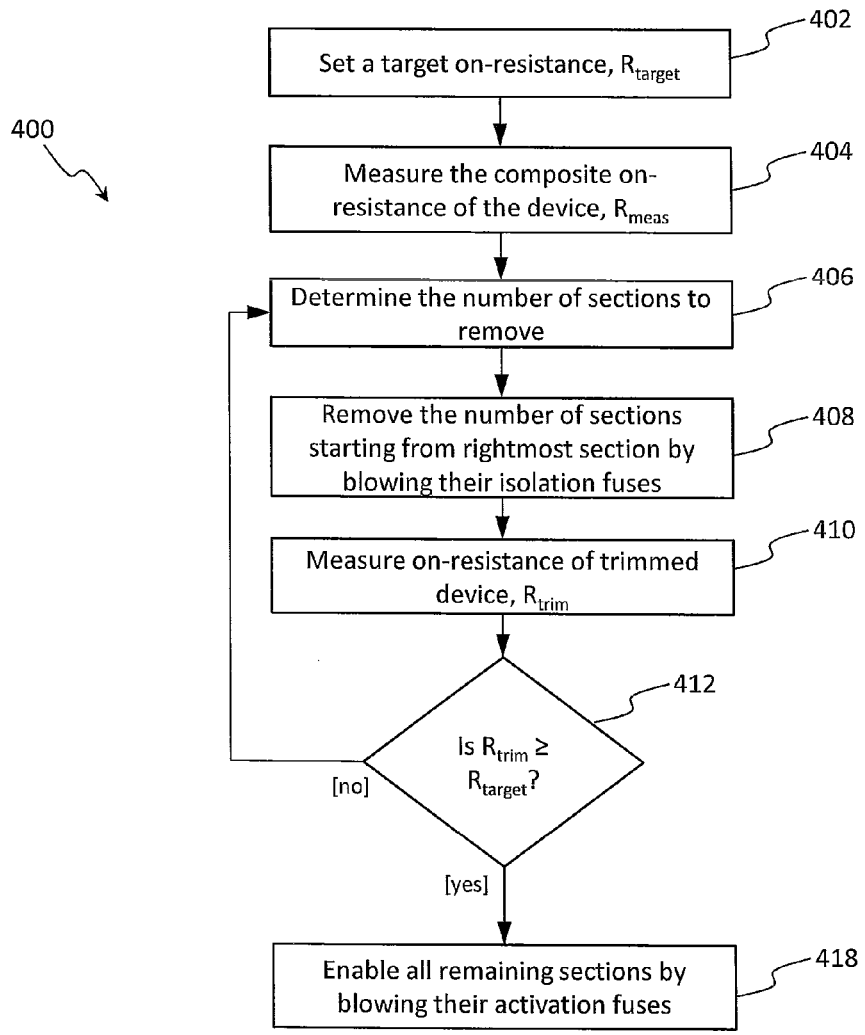
FIG. 4 illustrates a procedure for trimming a trimmable composite VDMOS device having multiple trim sections to achieve a target on-resistance.

Referring to FIG. 4, an example procedure 400 for trimming composite device 300 to a target on-resistance is described as follows. At step 402, a target on-resistance $R_{target}$ is selected where $R_{target}$ is greater than the on-resistance of the untrimmed composite VDMOS device. At step 404, the on-resistance of the untrimmed composite VDMOS device is measured. In a preferred embodiment, the measurement of on-resistance is performed in the linear region of the composite VDMOS device. Example conditions for measuring on-resistance are to measure $I_d$ (drain current) when $V_{gs}$ is set to 10V and when $V_{ds}$ is set to 0.1V; then on-resistance is calculated as $I_d/V_{ds}$.

At step 406, based on the measured on-resistance from step 404, a calculation is made to determine how many of the trim sections to remove to achieve the target on-resistance. When the measured on-resistance is less than the target on-resistance, there is a positive percentage difference between the target on-resistance and the measured composite on-resistance given by $\Delta R = (R_{target} - R_{meas})/R_{meas}$. Then, the number of trim sections to remove is given by $N_{remove} = \Delta R/F_{trim}$.

For example, consider a composite VDMOS device as in FIG. 3B with a primary device and n=20 (twenty) device trim sections where the primary device has one-half (50%) of the composite device's conducting area, $A_{total}$, and each device trim section has an area $A_{trim}$ of one fortieth of the composite device's conducting area. Then $F_{trim} = A_{trim}/A_{total}$ is 2.5%. If the target on-resistance is 5% greater than the measured on-resistance of the untrimmed composite device, then dividing $\Delta R = 5\%$ by $F_{trim} = 2.5\%$ indicates that two of the device sections should be trimmed to approach the target. If the target on-resistance is 7% greater than the measured on-resistance, then dividing 7% by 2.5% indicates that approximately three of the device sections should be trimmed to approach the target on-resistance. This example implementation is not intended to be limiting. Other implementations can involve more or fewer device trim sections and/or device trim sections having unequal conducting areas by design.

The procedure 400 continues at step 408, where, starting with the right-most isolation fuse that is still active, isolation fuses are blown until the calculated number of trim sections is removed. Blowing the isolation fuses from right to left increases the overall on-resistance of the device. For example, in FIG. 3A, isolation fuses are blown starting with isolation fuse 330 and ending with isolation fuse 324. At step 410, the trimmed on-resistance of the composite device is measured.

At step 412, the trimmed on-resistance is compared to the target on-resistance and if the trimmed on-resistance is still lower than the target on-resistance and not within a predefined tolerance of the target on-resistance, then the procedure is repeated, beginning with step 406, until the target on-resistance is attained.

At step 412, if the trimmed on-resistance is within a predefined tolerance range of the target on-resistance, step 418 is performed, where each remaining trim section (each trim section to the left of the last blown isolation fuse) is permanently enabled by blowing its corresponding activation fuse. For example, in FIG. 3A, activation fuse 314 is blown when isolation fuse 326 is blown.

An analogous procedure to procedure 400 is followed for trimming the current-carrying capability (conductance) of a composite device to meet a target current-carrying capability where the untrimmed composite current-carrying capability is greater than a trimmed current-carrying capability. This same procedure may be used to match the on-resistance or current-carrying capability of two or more IGBTs, or two or more vertical diodes, on the same or on separate die.

Figure 5A:
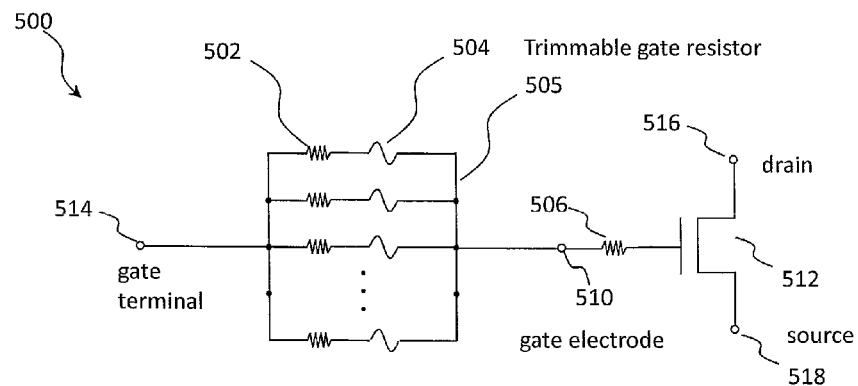
FIG. 5A illustrates a composite VDMOS device having a trimmable gate resistor with trimmable sections connected in parallel and with each trimmable section having a resistor in series with a trim fuse.

Referring to FIG. 5A, a third embodiment of a VDMOS device architecture is described where a trimmable VDMOS device element 500 includes a VDMOS device 512 connected in series with a trimmable gate resistor 505 to a gate terminal 514. VDMOS device 512 has a source electrode 518, a drain electrode 516 and a gate electrode 510 where the gate electrode has an intrinsic resistance 506. Gate electrode 510 is connected to trimmable gate resistor 505 which includes a set of r gate resistors 502 connected in parallel through a set of gate fuses 504. The switching time of trimmable VDMOS device element 500 is selectable by blowing one or more of the set of gate fuses 504. The number of parallel gate resistors r may be any number greater than one based on device size limitations and trim precision requirements. In a related embodiment, each parallel gate resistor in the set of r gate resistors has a different resistance and in another related embodiment, each parallel gate resistor has the same resistance.

Figure 5B:
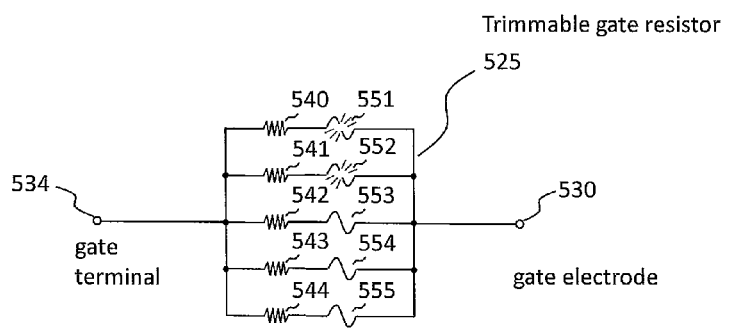
FIG. 5B illustrates an example configuration of a trimmable gate resistor.

Referring to FIG. 5B, an example configuration of the trimmable gate resistor is shown. Trimmable gate resistor 525 is connected between gate terminal 534 and gate electrode 530. Trimmable gate resistor 525 includes trimmable resistors 540-544 connected in parallel through gate fuses 551-555. Gate fuse 551 and gate fuse 552 are blown. Gate fuses 553-555 are connected. The resistance of the trimmable gate resistor as configured in FIG. 5B is the resistance of the parallel resistive network of the resistors 542-544 which is greater than the resistance of the original parallel resistive network of resistors 540-544.

Figure 6:
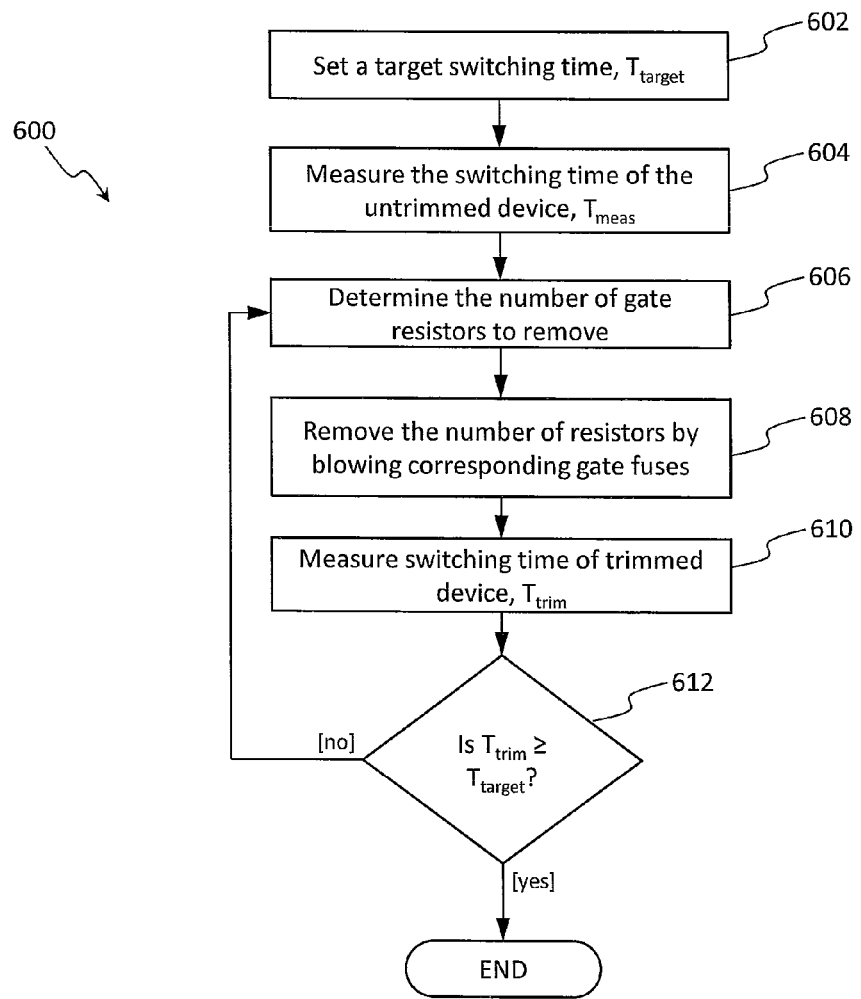
FIG. 6 illustrates a procedure for trimming the switching time of a composite VDMOS device having a trimmable gate resistor where the switching time is trimmed to achieve a target switching time.

Referring to FIG. 6, an example procedure 600 for trimming VDMOS device element 500 to a specific switching time is as follows. At step 602, a target switching time is selected. At step 604, the switching time of the untrimmed device is measured using techniques well-known in the industry. At step 606, the measured switching time is compared with the target switching time and a prediction is made of a number of parallel gate fuses that must be blown to achieve the target switching time. At step 608, the number of parallel gate fuses is blown, removing their corresponding parallel gate resistors from trimmable gate resistor 505. At step 610, the switching time $T_{trim}$ of the trimmed VDMOS device element is measured. At step 612, the switching time $T_{trim}$ of the trimmed VDMOS device element is compared to the target switching time, $T_{target}$. If $T_{trim}$ is greater than or equal to $T_{target}$ within a predefined tolerance, then the procedure ends. If the $T_{trim}$ is still less than $T_{target}$, then the procedure repeats at step 606.

At step 606 the number of parallel gate fuses to blow is determined as follows. Switching time is proportional to gate resistance; therefore, an increase in gate resistance by a certain percentage increases the switching time by the same percentage. For a number of r of parallel resistors, with each parallel gate resistor having the same resistance, removing one parallel resistor from the trimmable resistor device raises the resistance of the trimmable resistor device by (1/r) percent. When the target switching time is greater than the measured switching time, there is a positive percentage difference between the target switching time and the measured switching time given by $\Delta T = (T_{target} - T_{meas})/T_{meas}$. Then, the number of parallel gate resistors to remove from the trimmable resistor device, and the corresponding number of gate fuses to blow, is given by $N_{remove} = r\Delta T$.

For example, consider the configuration shown in FIG. 5B with r=5 (five) trimmable gate resistors. In this example, each of the five trimmable resistors has an identical resistance value, so trimming off each resistor increases the original composite gate resistance by 20% (one-fifth). If the target switching time value is $\Delta T = 20\%$ higher than the initially measured switching time value, then $r\Delta T = 1$, indicating that one of the trimmable resistors should be trimmed to cause the switching time to approach the target switching time. If the target switching time value is 65% higher than the initially measured gate resistance value, then $r\Delta T = (5)(0.65)$, indicating that approximately three of the trimmable gate resistors should be trimmed to approach the target. In FIG. 5B, two trimmable gate resistors are removed, resulting in a target switching time 40% higher than a gate resistance with all of the trimmable gate fuses connected. This is just an example of implementation. Similar implementations could include more or fewer trimmable gate resistors and/or gate resistors having unequal resistance values by design.

Figure 7:
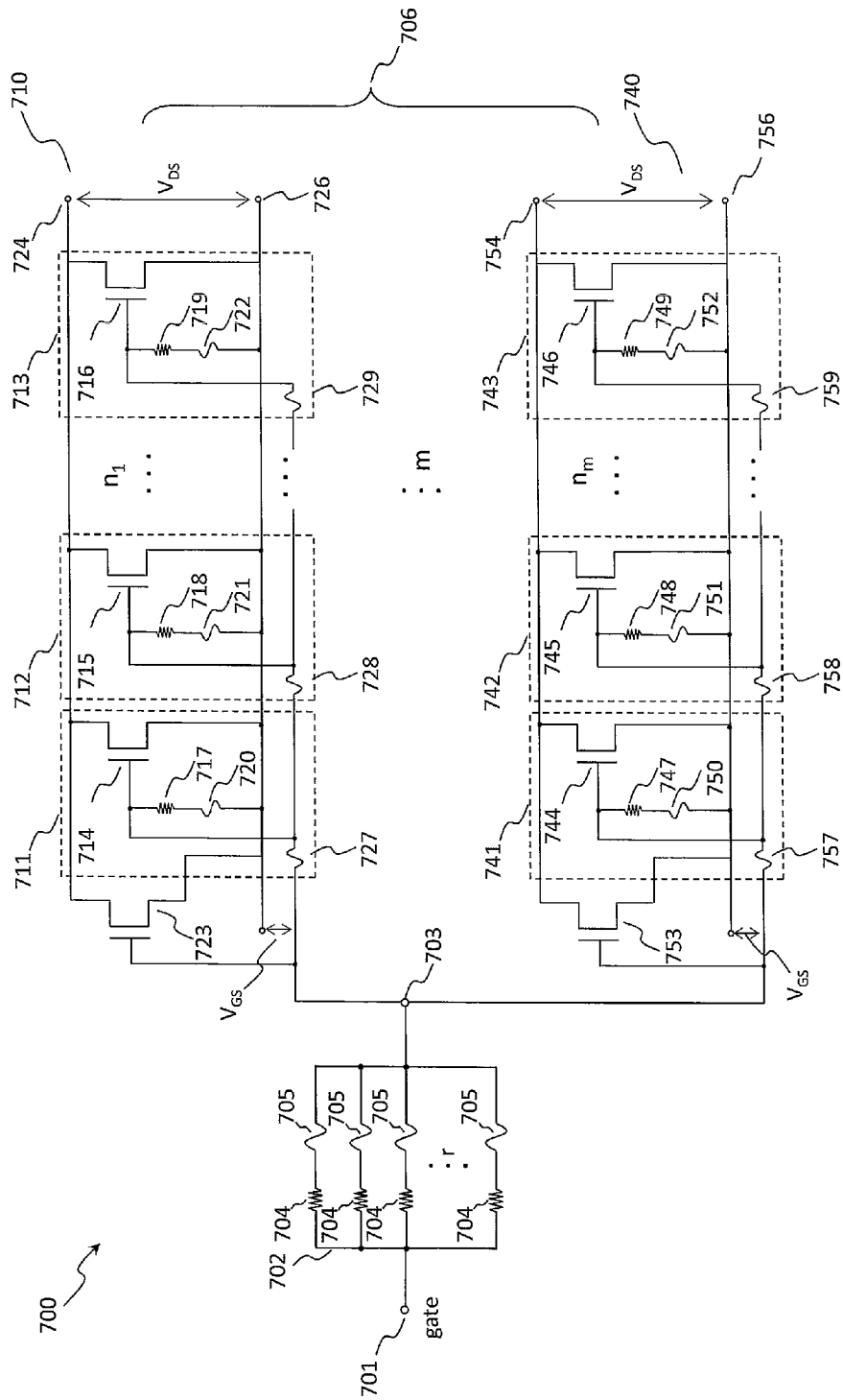
FIG. 7 illustrates a composite VDMOS device having a trimmable gate resistor connected in series with a set of trimmable composite devices where the composite VDMOS device has a trimmable switching time which is achieved by first trimming the threshold voltage and subsequently trimming the gate resistance.

FIG. 7 illustrates a fourth embodiment for a VDMOS device architecture. Composite device 700 includes a set of m trimmable composite devices 706 connected to internal gate terminal 703. Internal gate terminal 703 is connected to gate terminal 701 through trimmable gate resistor 702. Trimmable gate resistor 702 includes a set of r gate resistors 704 connected in parallel through a set of r gate resistor fuses 705. The number r of parallel gate elements in trimmable gate resistor 702 may be any number greater than one, based on device size limitations and trim precision requirements.

The set of m trimmable composite devices 706 includes trimmable composite device 710 through trimmable composite device 740. Trimmable composite device 710 consists of $n_1$ interconnected device trim sections connected to a primary device 723. The $n_1$ interconnected device trim sections includes trim sections 711-713. The gate electrode of primary device 723 is connected to internal gate terminal 703. A set of $n_1$ isolation fuses including isolation fuses 727-729 is connected in series to internal gate terminal 703. The drain electrode of primary device 723 is connected to drain terminal 724. The source electrode of primary device 723 is connected to source terminal 726. Drain-source voltage $V_{DS}$ is applied between source terminal 726 and drain terminal 724. Gate-source voltage $V_{GS}$ is applied between source terminal 726 and gate terminal 703.

Trim section 711 includes a VDMOS device 714, with its drain electrode connected to drain terminal 724 and its source electrode connected to source terminal 726. The gate electrode of VDMOS device 714 is connected to internal gate terminal 703 through isolation fuse 727. The gate electrode of VDMOS device 714 is further connected to source terminal 726 through pull-down resistor 717 in series with activation fuse 720.

Trim section 712 includes a VDMOS device 715, with its drain electrode connected to drain terminal 724 and its source electrode connected to source terminal 726. The gate electrode of VDMOS device 715 is connected to internal gate terminal 703 through isolation fuse 728 and isolation fuse 727. The gate electrode of VDMOS device 715 is further connected to source terminal 726 through pull-down resistor 718 in series with activation fuse 721.

Trim section 713 includes a VDMOS device 716, with its drain electrode connected to drain terminal 724 and its source electrode connected to source terminal 726. The gate electrode of VDMOS device 716 is connected to internal gate terminal 703 through isolation fuses 727-729 and all intermediate isolation fuses connecting isolation fuses 728 and 729. The gate electrode of VDMOS device 716 is further connected to source terminal 726 through pull-down resistor 719 in series with activation fuse 722.

Trimmable composite device 740 consists of $n_m$ interconnected device trim sections connected to a primary device 753. The $n_m$ interconnected device trim sections includes trim sections 741-743. The gate electrode of primary device 753 is connected to internal gate terminal 703. A set of $n_m$ isolation fuses including isolation fuses 757-759 are connected in series to internal gate terminal 703. The drain electrode of primary device 753 is connected to drain terminal 754. The source electrode of primary device 753 is connected to source terminal 756. Drain-source voltage $V_{DS}$ is applied between source terminal 756 and drain terminal 754. Gate-source voltage $V_{GS}$ is applied between source terminal 756 and gate terminal 703.

Trim section 741 includes a VDMOS device 744, with its drain electrode connected to drain terminal 754 and its source electrode connected to source terminal 756. The gate electrode of VDMOS device 744 is connected to internal gate terminal 703 through isolation fuse 757. The gate electrode of VDMOS device 744 is further connected to source terminal 756 through pull-down resistor 747 in series with activation fuse 750.

Trim section 742 includes a VDMOS device 745, with its drain electrode connected to drain terminal 754 and its source electrode connected to source terminal 756. The gate electrode of VDMOS device 745 is connected to internal gate terminal 703 through isolation fuse 758 and isolation fuse 757. The gate electrode of VDMOS device 745 is further connected to source terminal 756 through pull-down resistor 748 in series with activation fuse 751.

Trim section 743 includes a VDMOS device 746, with its drain electrode connected to drain terminal 754 and its source electrode connected to source terminal 756. The gate electrode of VDMOS device 746 is connected to internal gate terminal 703 through isolation fuses 757-759 and all intermediate isolation fuses connecting isolation fuses 758 and 759. The gate electrode of VDMOS device 746 is further connected to source terminal 756 through pull-down resistor 749 in series with activation fuse 752.

The switching time of composite device 700 is configurable by blowing one or more of the set of r gate resistor fuses 705. The threshold voltage, on-resistance and conductance of a trimmable composite device in the set of m trimmable composite devices is configurable alone or in combination by blowing one or more of the set of isolation fuses in the trimmable composite device.

Figure 8:
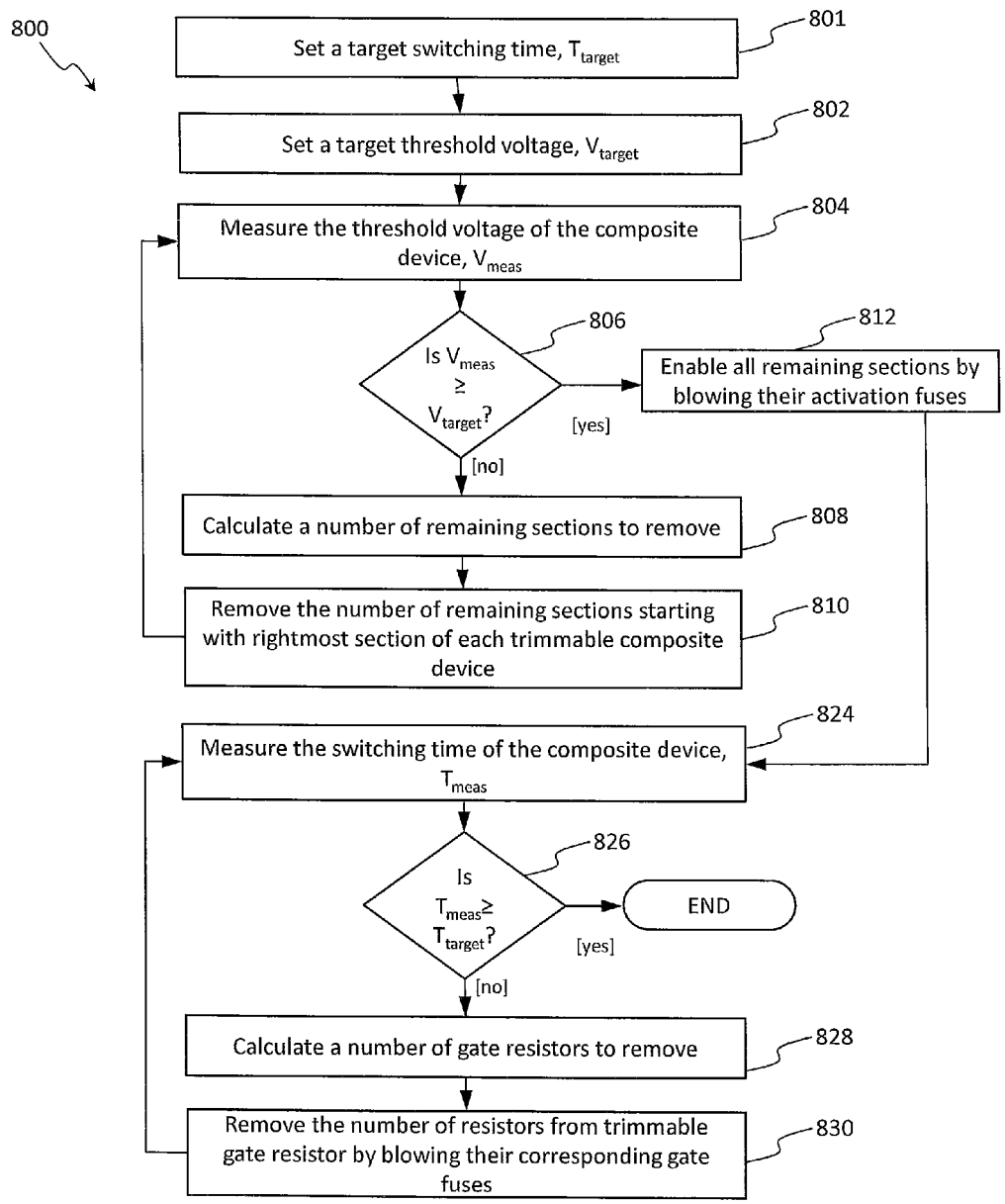
FIG. 8 illustrates a procedure for trimming the switching time and the threshold voltage of a composite VDMOS device having a trimmable gate resistor and a set of trimmable composite devices.

Referring to FIG. 8, an example procedure 800 for trimming the switching time and independently trimming the threshold voltage of composite device 700 is as follows. At step 801, a target switching time is selected. At step 802, a target threshold voltage $V_{target}$ is selected. At step 804, the threshold voltage $V_{meas}$, of the composite device, is measured. At step 806, $V_{meas}$ is compared to the $V_{target}$. If, at step 806, $V_{meas}$ is greater than or equal to $V_{target}$ within a predefined threshold voltage tolerance, then, at step 812, the remaining trim sections are activated by blowing their activation fuses and the procedure continues at step 824. If, at step 806, $V_{meas}$ is less than $V_{target}$, then the procedure continues at step 808, where a number of remaining trim sections to remove is calculated. Then, at step 810, the isolation fuses are blown for the number of remaining trim sections to remove, starting from the rightmost trim section proceeding to the left. The procedure repeats at step 804, until $V_{meas}$ is greater than or equal to $V_{target}$ within the predefined threshold voltage tolerance.

At step 824, switching time, $T_{meas}$, of the trimmed composite device is measured. At step 826, the measured switching time $T_{meas}$ is compared to the target switching time $T_{target}$. If at step 826, $T_{meas}$ is greater than or equal to $T_{target}$ within a predefined switching is time tolerance, then the procedure 800 ends. If at step 826, $T_{meas}$ is less than $T_{target}$, then, at step 828, a number of gate resistors to remove is calculated. At step 830, the calculated number of gate fuses is blown. The procedure repeats at step 824 until $T_{meas}$ is greater than or equal to $T_{target}$ within the predefined switching time tolerance.

Figure 9A:
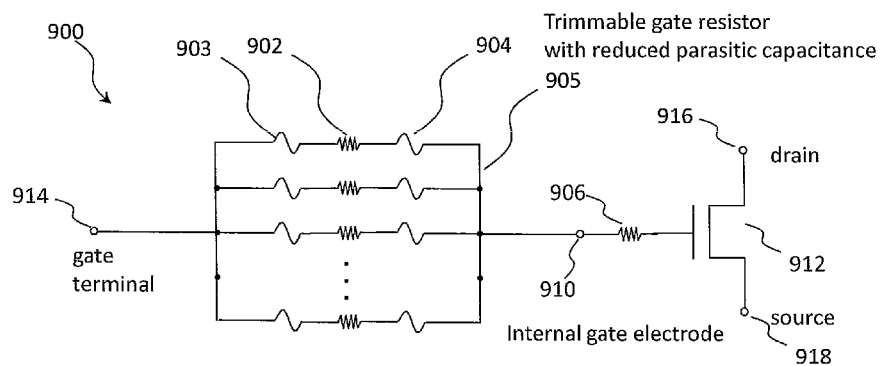
FIG. 9A illustrates a composite VDMOS device having trimmable gate resistor with reduced parasitic capacitance including trimmable sections connected in parallel and with each trimmable section having a resistor in series with a pair of trim fuses.

Referring to FIG. 9A, a fifth embodiment of a VDMOS device architecture is illustrated by a trimmable VDMOS device element 900 where a trimmable gate resistor 905 consists of two fuses per gate resistance segment. Trimmable gate resistor 905 can be substituted in any of the embodiments requiring a trimmable resistor element.

Trimmable VDMOS device element 900 includes a VDMOS device 912 connected in series with trimmable gate resistor 905 to a gate terminal 914. VDMOS device 912 has a source electrode 918, a drain electrode 916 and an internal gate electrode 910 where the internal gate electrode has an intrinsic resistance 906. Internal gate electrode 910 is connected to trimmable gate resistor 905 which includes a set of r gate resistors 902 connected in parallel through a first set of gate fuses 903 and a second set of gate fuses 904 where each gate resistor in the set of r gate resistors is connected in series to the gate terminal through a first gate fuse and further connected in series to the internal gate electrode through a second gate fuse. In this configuration, the parasitic capacitance associated with any resistors disconnected in the trimmable gate resistor 905 is reduced by blowing both connecting fuses to the disconnected resistor.

The number of parallel gate resistors r may be any number greater than one based on device size limitations and trim precision requirements. In a related embodiment, each parallel gate resistor in the set of r gate resistors has a different resistance and in another related embodiment, each parallel gate resistor has the same resistance.

Figure 9B:
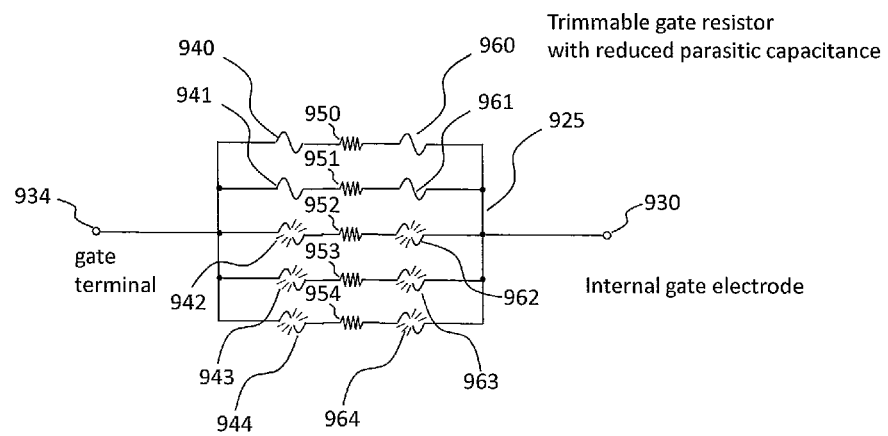
FIG. 9B illustrates an example configuration of a trimmable gate resistor with reduced parasitic capacitance.

Referring to FIG. 9B, an example configuration of the trimmable gate resistor is shown. Trimmable gate resistor 925 is connected between gate terminal 934 and gate electrode 930. Trimmable gate resistor 925 includes trimmable resistor 950 connected to gate terminal 934 through gate fuse 940 and connected to internal gate electrode 930 through gate fuse 960. Trimmable gate resistor 925 also includes trimmable resistor 951 connected to gate terminal 934 through gate fuse 941 and connected to internal gate electrode 930 through gate fuse 961. Trimmable gate resistor 925 also includes trimmable resistor 952 connected to gate fuse 942 and connected to gate fuse 962. Trimmable gate resistor 925 also includes trimmable resistor 953 connected to gate fuse 943 and connected to gate fuse 963. Trimmable gate resistor 925 also includes trimmable resistor 954 connected to gate fuse 944 and connected to gate fuse 964.

Gate fuses 942-944 and gate fuses 962-964 are blown. Gate fuses 940-941 and 960-962 are connected. Gate resistors 952-954 are disconnected from gate terminal 934 and from gate terminal 930 removing any parasitic capacitance associated with them. The resistance of the trimmable gate resistor as configured in FIG. 9B is the resistance of the parallel resistive network of the resistors 950-951 which is greater than the resistance of the original parallel resistive network of resistors 950-954.

Figure 10:
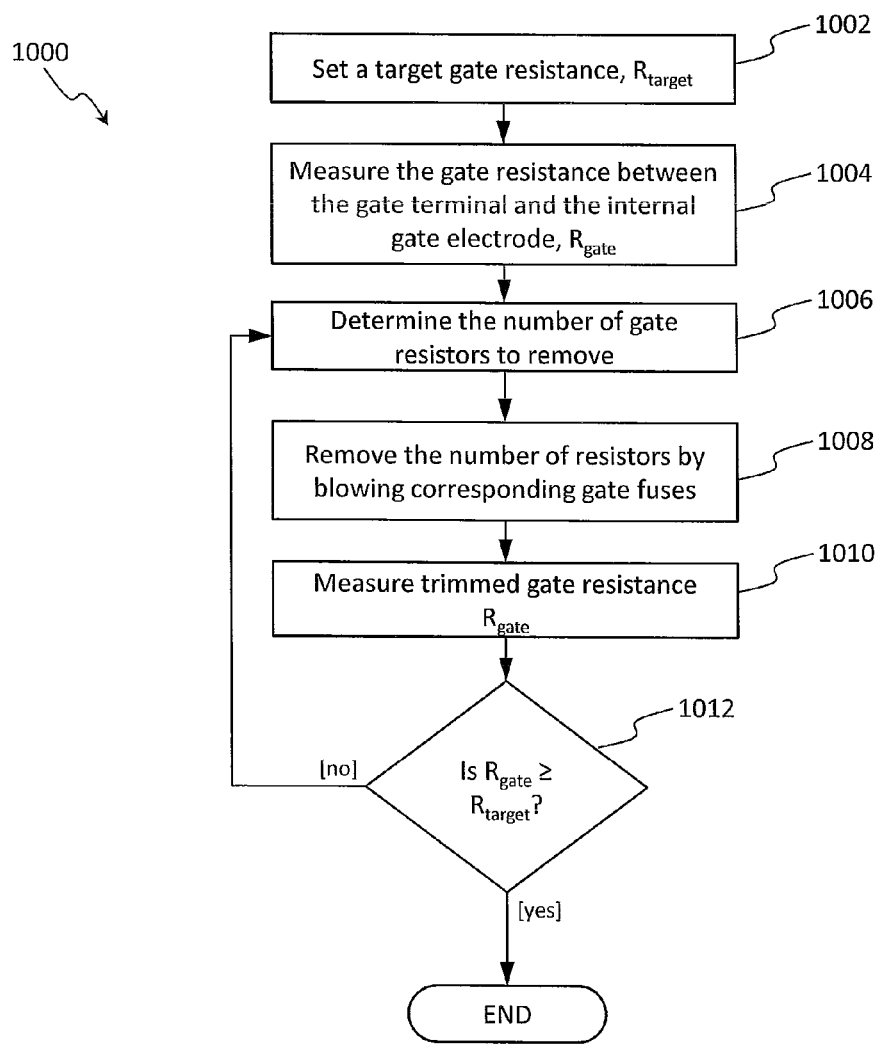
FIG. 10 illustrates a procedure for trimming the gate resistance of a composite VDMOS device having a trimmable gate resistor from an untrimmed composite gate resistance to achieve a target gate resistance.

Referring to FIG. 10, in using the trimmable gate resistor of either the third embodiment of FIG. 5A or the fifth embodiment of FIG. 9A, a procedure 1000 may be used to trim the gate resistance to a specific gate resistance. For example, gate resistances of two or more VDMOSs or IGBTs can be matched using procedure 1000 on the same or separate die.

At step 1002, a target gate resistance $R_{target}$ is determined. At step 1004, the gate resistance $R_{gate}$ between the gate terminal and the internal gate electrode of an untrimmed device is measured directly using probe pads or estimated using measurements of sample devices or test structures. At step 1006, the measured gate resistance $R_{gate}$ is compared to the target gate resistance $R_{target}$, and a calculation, based on the difference between $R_{gate}$ and $R_{target}$ and the number of trimmable resistors in the design, is performed to predict a number of gate fuses that must be blown to achieve the target gate resistance. At step 1008, the calculated number of gate fuses is blown. At step 1010, the gate resistance $R_{gate}$ of the trimmed device is measured. At step 1012, the trimmed gate resistance and the target gate resistance are compared. If, at step 1012, the measured gate resistance is greater than or within a desired tolerance of the target gate resistance, the procedure is stopped. If, at step 1012, the measured gate resistance is less than the target gate resistance and outside of the desired tolerance, then steps 1006, 1008 and 1010 are repeated until the gate resistance is greater than or within a desired tolerance of the target gate resistance.

At step 1006, a number of gate fuses to blow is determined. For a number of r of resistors in a trimmable resistor device, with each resistor having the same resistance, removing one resistor from the trimmable resistor device raises the resistance of the trimmable resistor device by a fraction $1/r$. When the measured resistance is less than the target resistance, there is a positive percentage difference between the target resistance and the measured resistance given by $\Delta R_{gate} = (R_{target} - R_{gate})/R_{gate}$. Then, the number of resistors to remove, and the number of gate fuses to blow, is given by $N_{remove} = r \Delta R_{gate}$.

For example, consider a configuration similar to that shown in FIG. 5A with r=5 (five) trimmable gate resistors and one non-trimmable intrinsic gate resistor. The non-trimmable gate resistor in this example has a value that is negligible compared to the value of the trimmable resistors. In this example, each of the trimmable resistors has an identical resistance value, so trimming off each resistor increases the original composite gate resistance by 20% (one-fifth). If the target gate resistance value is $\Delta R_{gate}$=20% higher than the initially measured gate resistance value, then $N = r\Delta R_{gate} = (5)(0.20)$, indicating that one of the trimmable resistors is to be trimmed to approach the target. If the target gate resistance value is 65% higher than the initially measured gate resistance value, then $N = r\Delta R_{gate} = (5)(0.65)$, indicating that approximately three of the trimmable gate resistors are to be trimmed to approach the target as shown in the example of FIG. 9B.

For the configuration of FIG. 9A two series connected fuses must be blown to remove a trimmable gate resistor and its related parasitic capacitance. Similar implementations could include more or fewer trimmable gate resistors and/or gate resistors having unequal resistance values by design.

In another embodiment, a specific breakdown voltage of a vertical diode may be obtained via laser trimming using multiple parallel device elements with at least two different breakdown voltages which bracket the target breakdown voltage. This may also be used to match the breakdown voltage of two or more vertical diodes on the same or on separate die. FIGS. 11A-11D illustrate this embodiment. A first element group contains one or more diodes with a first breakdown voltage ($V_1$), while a second element group contains one or more diodes with a second breakdown voltage ($V_2$), and so forth, with an $n^{th}$ element group having an $n^{th}$ breakdown voltage level ($V_n$). In this embodiment, breakdown voltage $V_1$ is set to be higher than the second breakdown voltage $V_2$, and so forth, with breakdown voltage $V_{n-1}$ set to be greater than breakdown voltage $V_n$. The composite breakdown voltage of the entire device is set, by the combination and size of the elements having breakdown voltage $V_1$, $V_2$, etc. through $V_n$, to be lower than the lowest selectable target breakdown voltage for the device. Trim fuses may be used in element groups to disable a particular diode trim section within an element group.

The breakdown voltage is commonly defined as the voltage at which the off-state device begins to electrically break down and pass a specified level of current. The breakdown voltage is typically measured by ramping the voltage on the high voltage (V-high) node with respect to the low voltage (V-low) node until a specified value of current, typically in the nano-ampere range, is reached.

All of the breakdown voltages are set by standard semiconductor MOS processing techniques such as ion implantation. The composite breakdown voltage of a composite device is set by the lowest breakdown voltage of the trim elements remaining after trimming. Since diode breakdown is a breakdown leakage current phenomenon, breakdown voltage can only be trimmed to be a more positive value when removing parallel elements as in this embodiment. Thus the composite breakdown voltage of the trimmable diode device is purposely set lower than a target range in order to trim the breakdown voltage positively into the target range. Before any fuses are blown, all of the diode trim elements are enabled (or active). Trim fuses are used to disconnect a diode trim section by disconnecting it from the high voltage node (V-high).

Figure 11A:
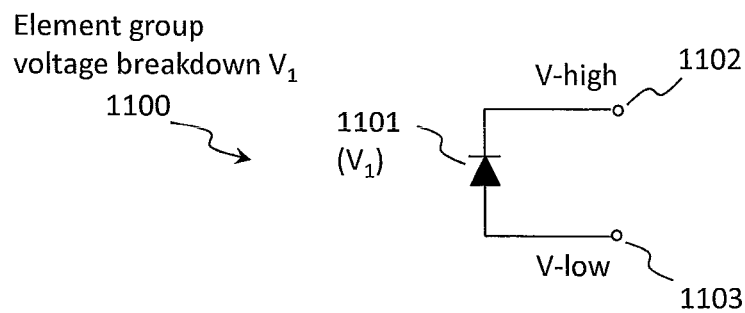
FIG. 11A illustrates a primary element group having a single non-trimmable element and a first breakdown voltage for use in a composite diode device.

Referring to FIG. 11A, a diode element 1100 includes one or more diode devices 1101 connected between a low voltage terminal 1103 and a high voltage terminal 1102 in a reversed bias configuration. Diode device 1101 achieves a device voltage breakdown of $V_1$. In parallel connection with diode element 1100, are one or more diode element groups (illustrated in FIGS. 11B and 11C) connected in parallel with diode element 1100, containing diode trim sections, where each diode trim section comprises one or more diodes connected in series with a respective trim fuse to disable the respective diode.

Figure 11B:
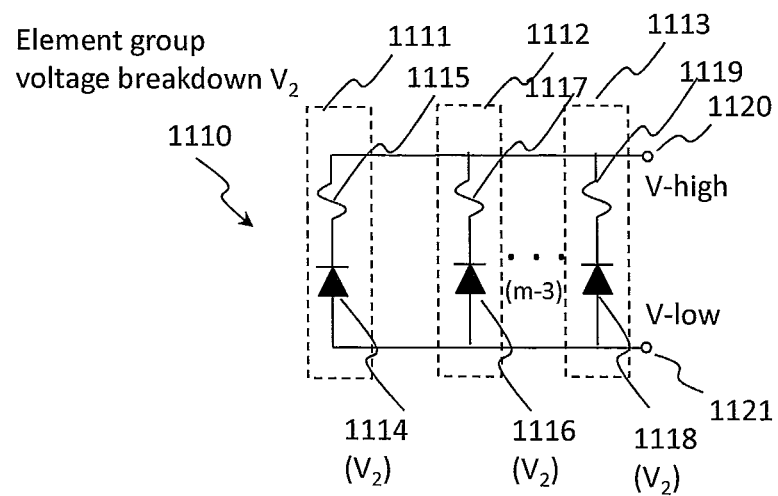
FIG. 11B illustrates an element group for use in a trimmable composite diode device having at least two trim elements and a selectable breakdown voltage.

Referring to FIG. 11B, an element group 1110 consists of one or more diode trim sections, (in this example, m diode trim sections) connected in parallel between low voltage terminal 1121 and high voltage terminal 1120. Diode trim section 1111 includes diode 1114 connected in series with a trim fuse 1115 between low voltage terminal 1121 and high voltage terminal 1120 in a reversed bias configuration. Diode trim section 1112 includes diode 1116 connected in series with a trim fuse 1117 between low voltage terminal 1121 and high voltage terminal 1120 in a reversed bias configuration. Diode trim section 1113 includes diode 1118 connected in series with a trim fuse 1119 between the low voltage terminal 1121 and high voltage terminal 1120 in a reverse bias configuration. There are (m−3) additional diode trim sections in element group 1110 connected between low voltage terminal 1121 and high voltage terminal 1120. All of the diode trim sections are connected in parallel between low voltage terminal 1121 and high voltage terminal 1120.

All of the diodes in element group 1110 have the same breakdown voltage $V_2$, where $V_2$ is lower than $V_1$. By trimming (or disabling) particular diodes in the element group, a target amount of current to be passed at a particular breakdown voltage for the overall composite diode device may be achieved.

Figure 11C:
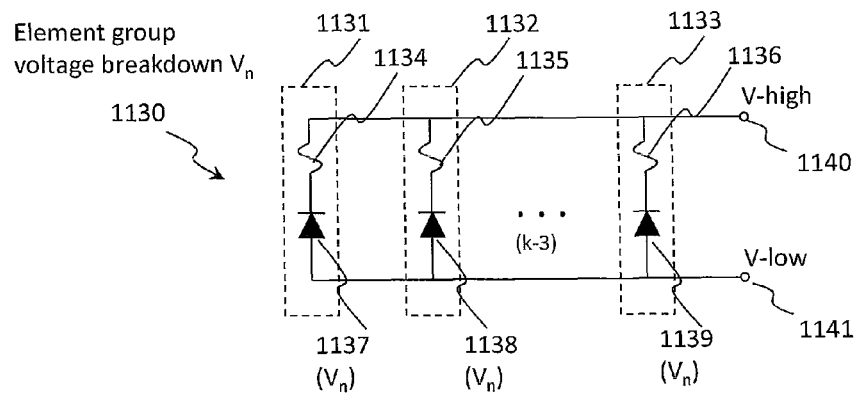
FIG. 11C illustrates an nth element group having one or more trim elements and an nth breakdown voltage, for use in a trimmable composite diode device.

Referring to FIG. 11C, an element group 1130 consists of one or more diode trim sections (in this example, k diode trim sections) connected in parallel including diode trim sections 1131, 1132 and 1133. Diode trim section 1131 includes diode 1137 connected in series with a trim fuse 1134 between low voltage terminal 1141 and high voltage terminal 1140 in a reversed bias configuration. Diode trim section 1132 includes diode 1138 connected in series with a trim fuse 1135 also between low voltage terminal 1141 and high voltage terminal 1140 in a reversed bias configuration. Diode trim section 1133 includes diode 1139 connected in series with a trim fuse 1136 also between low voltage terminal 1141 and high voltage terminal 1140 in a reversed bias configuration. There are (k−3) additional diode trim sections connected between low voltage terminal 1141 and high voltage terminal 1140. All of the diode trim sections are connected in parallel between low voltage terminal 1141 and high voltage terminal 1140.

All of the diodes in element group 1130 have a breakdown voltage $V_n$, where $V_n$ is lower than $V_1$ and $V_2$. Again, by trimming (or disabling) particular diodes in the element group, a target amount of current to be passed at a particular breakdown voltage for the overall composite diode device may be achieved. Combining diode element groups, such as 1110 and 1130, in parallel with diode element 1100, a target breakdown voltage for the overall composite diode device may be selected by selectively disabling diodes within one or more of the diode element groups.

Figure 11D:
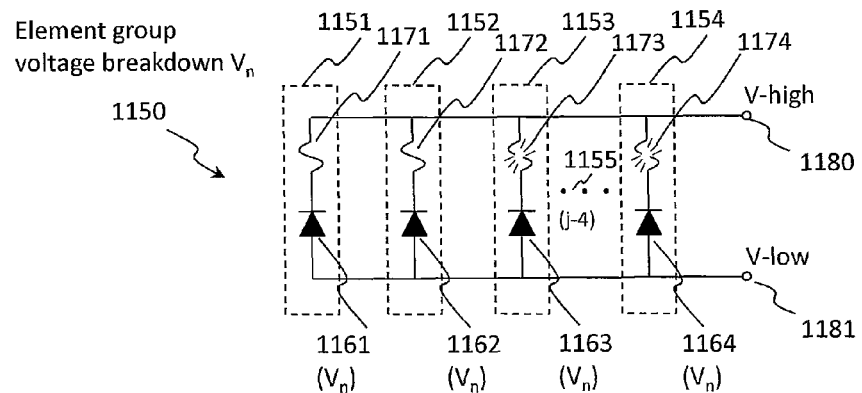
FIG. 11D illustrates an example configuration of an element group having multiple trim elements and a configured strength of breakdown voltage $V_n$, for use in a trimmable composite diode device.

Referring to FIG. 11D, a configuration of a diode element group is shown. An element group 1150 consists of j diode trim sections connected in parallel including diode trim sections 1151, 1152, 1153 and 1154. Diode trim section 1151 includes diode 1161 connected in series with a trim fuse 1171 between low voltage terminal 1181 and high voltage terminal 1180 in a reversed bias. Diode trim section 1152 includes diode 1162 connected in series with a trim fuse 1172 also between low voltage terminal 1181 and high voltage terminal 1180 in a reversed bias. Diode trim section 1153 includes diode 1163 connected in series with a trim fuse 1173 also between low voltage terminal 1181 and high voltage terminal 1180 in a reversed bias. Diode trim section 1154 includes diode 1164 connected in series with a trim fuse 1174 also between low voltage terminal 1181 and high voltage terminal 1180 in a reversed bias. There are (j−4) intermediate diode trim sections 1155 connected between low voltage terminal 1181 and high voltage terminal 1180. All of the diode trim sections are connected in parallel between low voltage terminal 1181 and high voltage terminal 1180.

All of the diodes in element group 1150 have the same breakdown voltage $V_n$, where $V_n$ is lower than breakdown voltage $V_1$.

In the configuration of FIG. 11D, all trim fuses in element group 1150 except trim fuse 1171 and trim fuse 1172 are blown. The composite breakdown voltage of element group 1150 is determined by the breakdown voltage of the diode trim sections 1151 and 1152. In a composite diode device where device element 1100 is connected in parallel with element group 1150, the composite breakdown voltage of the composite device will be the combination of the breakdown voltages for the diode(s) in device element 1100 and the breakdown voltages for the enabled (or active) diodes in element group 1150.

Figure 12:
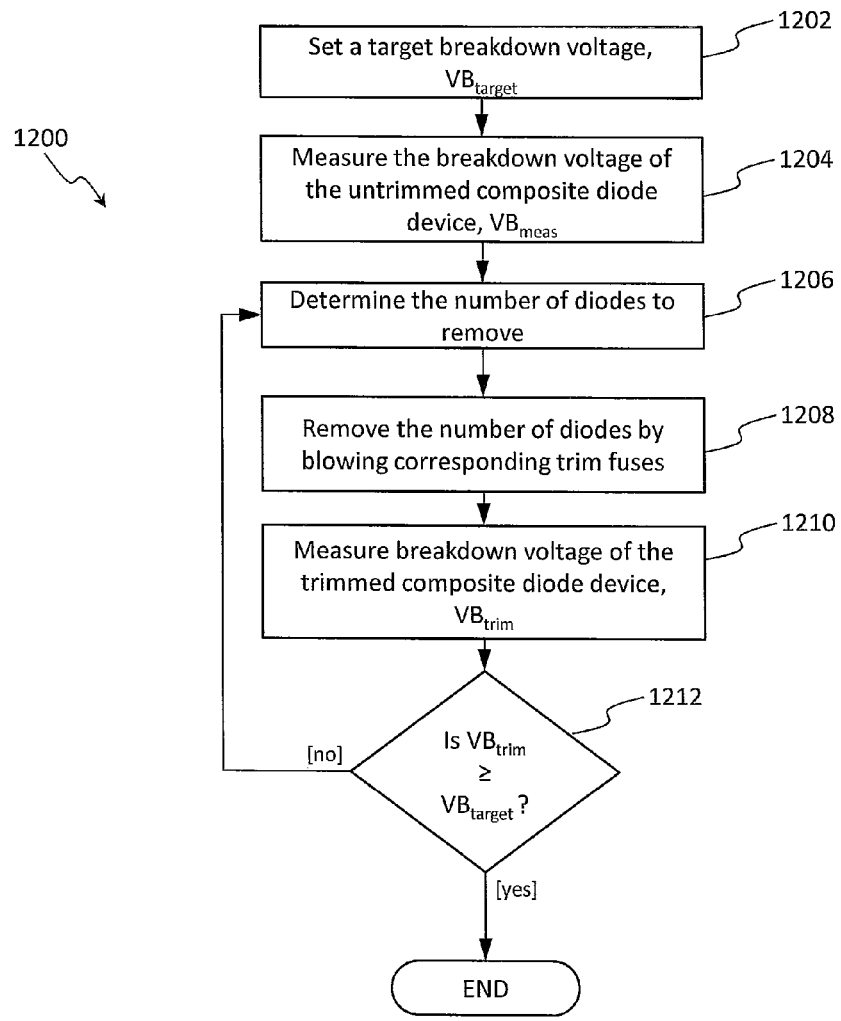
FIG. 12 illustrates a procedure for trimming the breakdown voltage of a trimmable composite diode device having multiple trim elements with monotonically increasing breakdown voltages.

Referring to FIG. 12, an example procedure 1200 for trimming a composite diode device containing device element 1100 and element group 1130 to a specific breakdown voltage is as follows. At step 1202, a target breakdown voltage is selected. At step 1204, the breakdown voltage of the untrimmed composite diode device is measured between the V-high and V-low terminals. At step 1206, based on the measured breakdown voltage, the target breakdown voltage, and the expected difference in breakdown voltage between each of the breakdown trim elements, a calculation is made to determine which diode trim elements in the element group are to be trimmed. At step 1208, the fuses are then blown for the diode trim elements indicated to be trimmed. Blowing trim fuses corresponding to the indicated diode trim elements will leave a set of remaining diode trim elements connected in parallel between the V-high and V-low terminals. At step 1210, the breakdown voltage $VB_{trim}$ of the trimmed composite device is measured.

At step 1212, if the measured breakdown voltage is greater than or equal to the target breakdown voltage within a predefined tolerance, then the procedure ends. If, at step 1212, the measured breakdown voltage $VB_{trim}$ is still lower than the targeted breakdown voltage $VB_{target}$ and outside the predefined tolerance, then the procedure repeats steps 1206, 1208, 1210 and 1212 until the target breakdown voltage is attained.

For example, a composite breakdown voltage target is selected to be 495V. If a composite trimmable diode device contains an m=10 diode element groups, each containing one trim element, and the expected difference in breakdown voltage between the trimmable element groups is 1V, then diode trim elements #10, #9, #8, #7, and #6 (corresponding to breakdown voltages of 490V, 491V, 492V, 493V, & 494V) would be need to be trimmed in order for the resultant composite breakdown voltage to be set to 495V.

This is just an example of implementation. Similar implementations could include trimmable element groups containing more than one element and/or unequal numbers of elements. The element groups and the elements therein might also be designed to have unequal differences in expected breakdown voltage, including device area-weighted differences.

While the foregoing embodiments illustrate examples where device trim elements are disabled or removed from the composite device operation in order to alter device parameters, such as to increase the threshold voltage, increase the on-resistance, decrease the current-carrying capability, increase the switching time, or increase the breakdown voltage for the composite device, the described architecture can be modified so that trim elements may also be enabled or added to the composite device operation, by blowing fuse links to add a trim element or otherwise enable the operation of a trim element with respect to the overall composite device, to thereby increase or decrease the desired parameter for the composite device using the same techniques described above.

The embodiments presented in this disclosure are intended to provide implementable examples of the present invention, but are not intended to limit the present invention. Other device types besides VDMOS can be used as a base device in a trimmable element group. For example, composite trimmable insulated gate bipolar transistor devices and other vertical MOSFET devices can be constructed using the methods and architectures of the disclosure. The disclosed embodiments are also not intended to be limited by the specific trimming devices and methods. For example, the trimming can be accomplished with laser fuses blown by applying laser light from a suitable laser, electrically programmable fuses such as electrically programmable fuses used in conjunction with charge-trapping non-volatile memory elements, and electrically-blowable fuses and anti-fuses.

The invention claimed is:

1. A method of making a vertical field effect device having a drain terminal, a source terminal and a gate terminal, the method comprising:
   providing a first field effect device connected to the drain terminal, the source terminal and the gate terminal;
   providing a set of second field effect devices, connected to the source terminal by a set of parallel activation fuses and connected to the gate terminal by a set of series isolation fuses;
   measuring a device parameter measurement value;
   comparing the device parameter measurement value to a target value; and,
   if the device parameter measurement value meets the target value, then blowing a parallel activation fuse of the set of parallel activation fuses.

2. The method of claim 1, wherein the step of blowing further comprises blowing a plurality of parallel activation fuses of the set of parallel activation fuses.

3. The method of claim 1, comprising the further step of:
   if the device parameter measurement value does not meet the target value, then blowing a series isolation fuse of the set of series of isolation fuses.

4. The method of claim 1, wherein the step of measuring further comprises measuring a threshold voltage.

5. The method of claim 1, wherein the step of measuring further comprises measuring an on-resistance value.

6. The method of claim 1, wherein the step of providing the set of second field effect devices further comprises the step of:
   providing a set of resistors connected to the set of parallel activation fuses.

7. The method of claim 1, wherein the gate terminal is further connected to a trimmable parallel resistor network and further comprising the step of:
   blowing a parallel resistor fuse of the parallel resistor network.

* * * * *